United States Patent [19]

Komatsu et al.

[11] Patent Number: 4,943,960
[45] Date of Patent: Jul. 24, 1990

[54] SELF-REFRESHING OF DYNAMIC RANDOM ACCESS MEMORY DEVICE AND OPERATING METHOD THEREFOR

[75] Inventors: Takahiro Komatsu; Masaki Kumanoya; Katsumi Dosaka; Yasuhiro Konishi, all of Hyogo, Japan

[73] Assignee: Mitsubishi Denki Kabushiki Kaisha, Tokyo, Japan

[21] Appl. No.: 337,976

[22] Filed: Apr. 14, 1989

[30] Foreign Application Priority Data

Jul. 19, 1988 [JP] Japan .................................. 63-179890

[51] Int. Cl.$^5$ ........................ G11C 8/00; G11C 11/24
[52] U.S. Cl. .................... 365/222; 365/203; 365/189.09
[58] Field of Search ............. 365/222, 203, 189.09, 365/205

[56] References Cited

U.S. PATENT DOCUMENTS

| | | | |
|---|---|---|---|
| 4,397,003 | 8/1983 | Wilson et al. | 365/205 |
| 4,660,180 | 4/1987 | Tanimura et al. | 365/222 |
| 4,688,196 | 8/1987 | Inagaki et al. | 365/222 |
| 4,692,689 | 9/1987 | Takemae | 365/226 X |
| 4,716,551 | 12/1987 | Inagaki | 365/222 |
| 4,736,344 | 4/1988 | Yanagisawa | 365/222 |

OTHER PUBLICATIONS

S. Saito "a 1Mb CMOS DRAM with Fast Page and Static Column Modes", IEEE International Solid-State Circuits Conference, Digest of Technical Papers, Feb. 15, 1985.

Michihiro Yamada et al., "A 64 Kbit MOS Synamic RAM with Auto/Self Refresh Functions", (The Journal of Electronics and Communications, Jan. 1983, vol. J66-C, No. 1, pp. 203-220).

Primary Examiner—Stuart N. Hecker
Assistant Examiner—Michael A. Whitfield
Attorney, Agent, or Firm—Lowe, Price, LeBlanc, Becker & Shur

[57] ABSTRACT

There is disclosed a dynamic random access memory device of the type capable of periodic self-refresh cycles of operation. The DRAM includes the detector circuit for detecting the designation of the self-refresh mode and a voltage generator circuit for generating a voltage to precharge the bit line pair. During the self-controlled refresh cycle, the bit line pair is equalized and precharged to a voltage lower than Vcc/2. When it is attempted to set the time interval between the self-refresh cycles in order to reduce current consumption, the level of voltage stored in the memory cell capacitor tends to decrease due to charge leakage. However, it is implemented to provide and keep a potential difference between the precharge voltage on the bit line pair and the voltage stored in the capacitor thereby to secure the desired sensing margin for the sense amplifier.

10 Claims, 10 Drawing Sheets

FIG.7A PRIOR ART
FIG.8 PRIOR ART
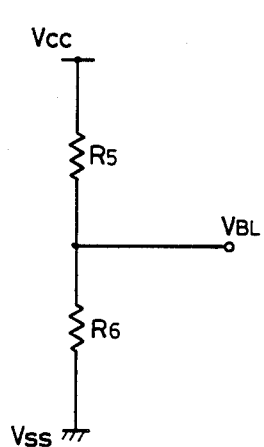
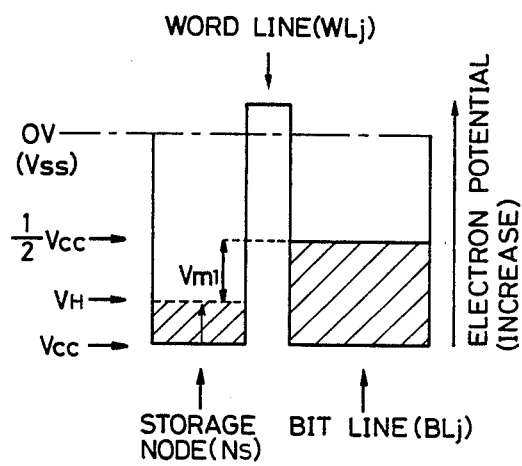
FIG.7B PRIOR ART
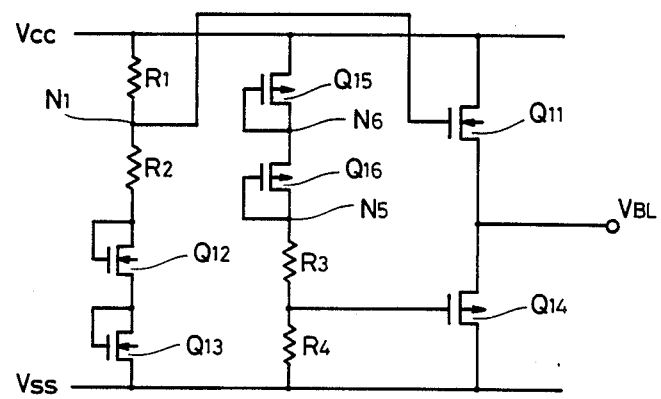

SELF-REFRESHING OF DYNAMIC RANDOM ACCESS MEMORY DEVICE AND OPERATING METHOD THEREFOR

BACKGROUND OF THE INVENTION

1. Field of the Invention

This invention relates generally to a dynamic random access memory device, and in particular to a dynamic random access memory device capable of performing a self-controlled periodic refresh cycle of operation.

2. Description of the Prior Art

Conventionally static random access memories or SRAMs have been used as battery backed-up memories in personal computers. In recent years, however, it has been proposed to employ dynamic random access memories or DRAMs because the DRAM has a higher storage capacity than the SRAM. For this purpose, it is desired that the DRAM dissipates a smallest possible amount of current while not being addressed in a data holding state.

In order to have a brief background understanding on the field of technology to which this invention pertains, reference is made to FIG. 5, which illustrates in block diagram an overall arrangement of a prior-art DRAM. The DRAM includes an array 58 of memory cells for storing data signals; an address buffer 54 for receiving address signals which select memory cells; row and column decoders for decoding the address signals; and a sense amplifier 63 for reading the stored data signal from the memory cells and amplifying them. The DRAM also includes an input buffer 59 for receiving data signal and an output buffer 60 for supplying data signals, both of which are connected to the memory array 58 through an I/O gate 57.

The address buffer 54 is connected to receive externally applied address signals ext. A0–A9 or internally applied address signals Q0–Q8 generated by a refresh counter 53. The refresh counter 53 is regulated by a refresh controller 52 in response to $\overline{RAS}$ and $\overline{CAS}$ signals applied thereto through the clock generator 51. A $V_{BL}$ circuit 62 for generating bit line precharge voltage (hereinafter referred to as $V_{BL}$) is connected to the memory array 58 via an equalizer circuit 61.

FIG. 6A shows the circuit configuration of a memory cell and its associated circuits in the prior-art DRAM. And FIG. 6B illustrates a timing diagram for the circuitry of FIG. 6A. This circuit arrangement is disclosed in Digest of Technical Papers for the 1985 International Solid-State Circuit Conference (ISSCC 85), pp. 252-253.

Referring to FIG. 6A, a memory cell M is shown connected between a bit line BLj and a word line WLi. The memory cell M comprises a capacitor Cs and an NMOS switching transistor Qs, while the sense amplifier 63 comprises a CMOS flip flop connected between the bit lines BLj and $\overline{BLj}$. The CMOS flip flop includes PMOS transistors Q3 and Q4 and NMOS transistors Q1 and Q2, and it is connected between a supply voltage Vcc and a ground potential Vss via a PMOS transistor $Q_{SP}$ and and an NMOS transistor $Q_{SN}$. The transistor $Q_{SP}$ and $Q_{SN}$ have their gates connected to receive sense trigger signals $S_P$ and $S_N$, respectively. The equalizer circuit 61 comprises an NMOS transistor Q5 connected between the bit line BLj and $\overline{BLj}$, and a pair of NMOS transistors Q6 and Q7 which series connected between the bit lines BLj and $\overline{BLj}$. These transistors have their gates connected to receive an equalizer signal EQ.

The precharge voltage generator circuit 62 is connected via the NMOS transistor $Q_{PR}$ to a junction between the transistors Q6 and Q7 by an $L_{BL}$ line. The I/O gate 57 comprises an NMOS transistor Q8 coupled between the bit line BLj and an input-output line I/O, and an NMOS transistor Q9 coupled between the bit line $\overline{BLj}$ and an input-output line $\overline{I/}$. The transistors Q8 and Q9 have their gates connected to receive signals Yj from the column decoder. A signal generator circuit 69 is provided to generate various control signals PR, EQ, $S_P$ and $S_N$ which will be explained below.

Referring now to FIGS. 6A and 6B, the read-out and refresh operations of the DRAM are described.

In a read-out operation, first, the signal generating circuit 69 provides an equalizer signal EQ and a precharge signal PR, in response to which the transistors $Q_{PR}$, Q5, Q6 and Q7 are turned on, and the bit lines BLj and $\overline{BLj}$ are brought to an equalize potential of $V_{BL}$ (usually Vcc/2). After the $\overline{RAS}$ signal falls to its low level, signals EQ and PR both shift to a low level. Then, the word line signal WLi rises to its high level to turn on the switching transistor $Q_S$ in the memory cell M. Upon receipt of a signal from the memory cell M, the potential on the bit line BLj undergoes a slight change, causing a small potential difference between the bit line BLj and the bit line $\overline{BLj}$ which is at Vcc/2.

Generally at this point, the signals $S_P$ and $S_N$ also undergo a change, driving the sense amplifier 63 into operation. Thus, the sense amplifier 63 amplifies the small potential difference between the bit lines BLj and $\overline{BLj}$. An application of a high level signal Yj to the gates of the transistors Q8 and Q9 causes an amplified data signal to be transferred through the transistors Q8 and Q9 to the input-output line I/O.

It is pointed out here that in the refresh cycle of operation, the amplified data signal is not applied to the input-output line I/O. Instead, it is supplied back to the capacitor Cs through the bit line BLj in the memory cell M.

Referring to FIGS. 7A and 7B, there are illustrated circuit configurations of a prior-art $V_{BL}$ circuit for generating bit line precharge voltage. The circuit configuration of FIG. 7B is disclosed in USP No. 4,692,689 issued to Takemae on Sept. 8, 1987 and entitled "FET Voltage Reference Circuit having Threshold Voltage Compensation".

As shown in FIG. 7A, the precharge voltage generator circuit 62 comprises resistors R5 and R6 which are series connected between the supply voltage Vcc and the ground potential Vss. A fixed level precharge voltage $V_{BL}$ is obtained at the junction between the resistors R5 and R6.

As shown in FIG. 7B, the generator circuit for the bit line precharge voltage $V_{BL}$ includes a first series-connection of resistors R1 and R2, NMOS transistors Q12 and Q13, all of which are series connected between the supply voltage Vcc and the ground potential Vss. The generator circuit also includes a second series-connection of PMOS transistors Q15 and Q16, resistors R3 and R4 which are similarly series connected between the supply voltage Vcc and the ground potential Vss. The output stage of the generator circuit comprises an NMOS transistor Q11 and a PMOS transistor Q14 of a third series connection between the supply voltage Vcc and the ground potential Vss. It is noted that the transistors Q12, Q13, Q15 and Q16 have their gates coupled to their respective drains. On the other hand, the transistor Q11 has its gate coupled to the junction between the resistors R1 and R2, while the transistor Q14 has its gate coupled to the junction between the resistors R3 and R4. With the circuit arrangement, the bit line precharging voltage $V_{BL}$ is provided at the junction point between the transistors Q11 and Q14.

As stated hereinabove, the memory cell for the DRAM usually has a capacitor of MOS structure for storing data representing charge, and the stored charge tends to be dissipated due to the charge leakage at the junction of the MOS type capacitor. In order to prevent the stored data-bearing charge from being lost, it is essential to periodically read out the stored data signals and write them back again after amplifying the read-out signals in a refresh cycle of operation.

As the refresh operation for the DRAM, the $\overline{RAS}$ only refresh and the $\overline{CAS}$ before $\overline{RAS}$ refresh are currently used in the industry. In the $\overline{RAS}$ only refresh, as in the normal read/write cycle of operation, row address signals are externally supplied to the DRAM during the $\overline{RAS}$ cycle. On the other hand, in the $\overline{CAS}$ before $\overline{RAS}$ refresh, the refresh cycle is initiated in response to the externally applied $\overline{CAS}$ before $\overline{RAS}$ signal, subsequent to which the refresh counter built in the DRAM sequentially generates row address signals under the control of $\overline{RAS}$ clock signals. The $\overline{CAS}$ before $\overline{RAS}$ refresh mode eliminates the need for externally supplied address signals, and it is called an auto-refresh mode.

In contrast to these refresh cycles performed under the control of externally supplied clock signals, the so-called self-refresh cycle operation has been proposed and put into actual use in the DRAM. In the self-refresh cycle, the timer and address counter built in the DRAM carry out the desired refresh operation automatically and on their own without the aid of clock signals supplied from the outside. This type of refresh operation is disclosed in an article entitled, "A 64Kbit MOS Dynamic RAM with Auto/Self Refresh Functions (the Journal of Electronics and Communications, January 1983, Vol. J66 –C, No. 1, pp. 103–110)".

In order to decrease the amount of electric current consumed in the DRAM during the self-refresh cycle, it is advisable to conduct the refresh operation at time intervals longer than those employed in the conventional refreshing procedures including the auto-refresh mentioned above. For example, in the case of a 1 M bit DRAM, it is a common practice to perform 512 refresh cycles at a time interval of 8 ms between cycles. If the timer is set to provide an interval of 16 ms between refresh cycles, then the current consumption would be considerably reduced. A rough estimate is now made assuming that the DRAM is normally supplied with an electric current Icc of about 100 μA and it consumes about 30 mA/220ns during every refresh cycle, then 550 μA is used up during 512 refresh cycles with a 8 ms inter-cycle interval, and 330μA during 512 refresh cycles with a 16 ms inter-cycle interval. In short, the current consumption could be saved by some 40% when the refresh cycle is repeated at an interval of 16 ms.

In this manner, the current consumption is considerably reduced if the refresh interval in the self-refresh cycles is set longer than that in the normal refresh cycles. However, it gives rise to a problem that the sense margin in reading out of the signal stored in the memory cell becomes smaller.

Referring to FIG. 8, there is illustrated relations between the bit line potential (electron potential) and the potential on the capacitor in the memory cell. As shown in FIG. 6A, in the N-type memory cell M, a voltage $V_H$ at the storage node Cs of a capacitor which holds a "H" level data signal is at the level of the supply voltage Vcc right after the data signal has been written into the memory cell M. However, due to the charge leakage at the junction between the capacitor Cs and the P-channel substrate of the DRAM, electrons (indicated by a hatched portion) are transferred from the substrate to the capacitor, resulting in an gradual decrease of the potential at the node Ns down to $V_H$. On the other hand, the bit line pair BLj and $\overline{BLj}$ between which the memory cell M is connected is precharged to ½Vcc. A potential change $\Delta V_{SH1}$ on the bit line BLj when the voltage held in the capacitor Cs is applied to the bit line under the condition is expressed as follows:

$$\Delta V_{SH1} = (V_H - Vcc/2) \times Cs \, (C_B + Cs) \quad (1)$$

where Cs: a capacitance of capacitor Cs $C_B$: a capacitance of bit line BLj

When an "L" level data signal is written into the capacitor Cs of the memory cell M, the node Ns is brought into an electron-saturated state where the potential at the node is 0 volts. This potential does not change as time passes because electrons are being continuously supplied. Thus, a potential change $\Delta V_{SL}$ on the bit line which is brought about by the application of the "L" level data signal from the capacitor Cs to the bit line BLj is given as:

$$\Delta V_{SL} = (Vcc/2) \times Cs/(C_B + Cs) \quad (2)$$

The potential change on the bit line BLj when the "H" level data signal is applied is smaller than that when the "L" level data signal is applied as expressed by the following equation:

$$\Delta V_{SL} - \Delta V_{SH1} \times (Vcc - V_H \times Cs/(C_B + Cs) \quad (3)$$

This means that the sensing margin for reading out the data signal falls from Vcc/2 to Vm2 due to the potential change on the node Ns from Vcc to $V_H$.

In view of the above described fact that the potential at the storage node Ns of the capacitor $C_B$ gradually decreases after the "H" level data signal has been written into the capacitor, setting the interval between refreshing cycles longer tends to adversely affect the reliable data storage of the DRAM.

SUMMARY OF THE INVENTION

One object of the invention is to improve the data storage reliability of a DRAM of the type which is capable of performing refreshing selectively at a first refresh rate and a second refresh rate.

Another object of the invention is to reduce the current consumption in a DRAM of the type which is capable of performing refreshing selectively at a first refresh rate and a second refresh rate.

Yet another object of the invention is to improve the sensing margin for sensing data signal in a DRAM of the type which is capable of performing refreshing selectively at a first refresh rate and a second refresh rate.

Still another object of the invention is to improve the data storage reliability of a DRAM of the type which is capable of performing self-controlled periodic refresh cycles.

Another object of the invention is to reduce the current consumption in a DRAM of the type which is capable of performing self-controlled periodic refresh cycles.

Still another object of the invention is to improve the sensing margin for sensing data signal in a DRAM of the type which is capable of performing self-controlled periodic refresh cycles.

Briefly described, a DRAM according to the invention has, besides the normal reading, writing and refreshing modes of operation, an additional self-controlled periodic refresh mode. The DRAM includes as its component parts: a pair of first and second bit lines; at least one memory cell having a capacitor element connected to the first bit line for storing a data voltage signal which has a tendency to change to the ground potential; an input circuitry for receiving a mode select signal for selecting either of the normal and additional modes of operation; a precharge voltage generating circuitry for generating a first level voltage between a power supply voltage and the ground potential and for generating a second level voltage between the first level voltage and the ground potential; a equalizer circuitry for bringing the bit line pair to an equalized potential of the first or second level voltage in response to the signal for the selecting the mode of operation. The memory cell also includes a switching device for transferring the data signal stored in the capacitor element in the memory cell to the first bit line in response to the address signal. The DRAM further includes a sense amplifier for amplifying a potential difference between the first and second bit lines.

In the additional refresh mode operation, the equalizer circuitry functions to equalize the bit line pair to the second level voltage. Then, the data signal stored in the capacitor element of the memory cell is applied to the first bit line through the switching device. At this point, the potential level of the data signal stored in the memory cell is falling toward the ground potential, but the narrowing of the sensing margin for the sense amplifier caused by the change of the potential level in the capacitor element is effectively prevented due to the fact that the second bit line is kept at the second level voltage. Accordingly, even if the interval between refresh cycles is set longer in order to reduce current consumption, the DRAM still retains a reliable data storage ability.

A DRAM in accordance with another aspect of the invention operates selectively at a first refresh rate and a second lower refresh rate. The DRAM comprises: a pair of first and second bit lines; at least one memory cell having a capacitor element connected to the first bit line for storing a data voltage signal which has a tendency to change to the ground potential; a precharge voltage generator circuitry for generating a first voltage level in the first refresh rate and for generating a second voltage level in the second refresh rate; a equalizer circuitry connected to the precharge voltage generating circuitry for equalizing the bit line pair to the first voltage level in the first refresh rate and to the second voltage level in the second refresh rate. The memory cell also includes a switching device for transferring the data signal stored in the capacitor element in the memory cell to the first bit line in response to the address signal. The DRAM further includes a sense amplifier for amplifying a potential difference between the first and second bit lines.

In accordance with a further aspect of the invention, in a DRAM operating selectively at a first refresh rate and a second lower refresh rate, comprises: a pair of first and second bit lines; at least one memory cell connected to the first bit line, the memory cell having a capacitor element for storing a data signal, the voltage level of said data signal stored in the capacitor element having a tendency to change toward a ground potential; a precharge voltage generator circuitry for generating a precharge voltage for said bit line pair; equalizer circuitry connected to the precharge voltage generator circuitry for equalizing the bit line pair to the precharge voltage generated from the precharge voltage generator circuitry. A method of operating the DRAM comprises the step of: refreshing the DRAM at the first refresh rate, while generating the precharge voltage at a first level; refreshing the DRAM at the second refresh rate, while generating the precharge voltage at a second lower level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B are circuit diagrams for the prior-art voltage generating circuit for generating bit line precharge voltage; and FIG. 8 is a schematic illustration showing the relationships between potentials on the memory cell capacitor and the bit line.

DESCRIPTION OF THE PREFERRED EMBODIMENTS

Figure 1:
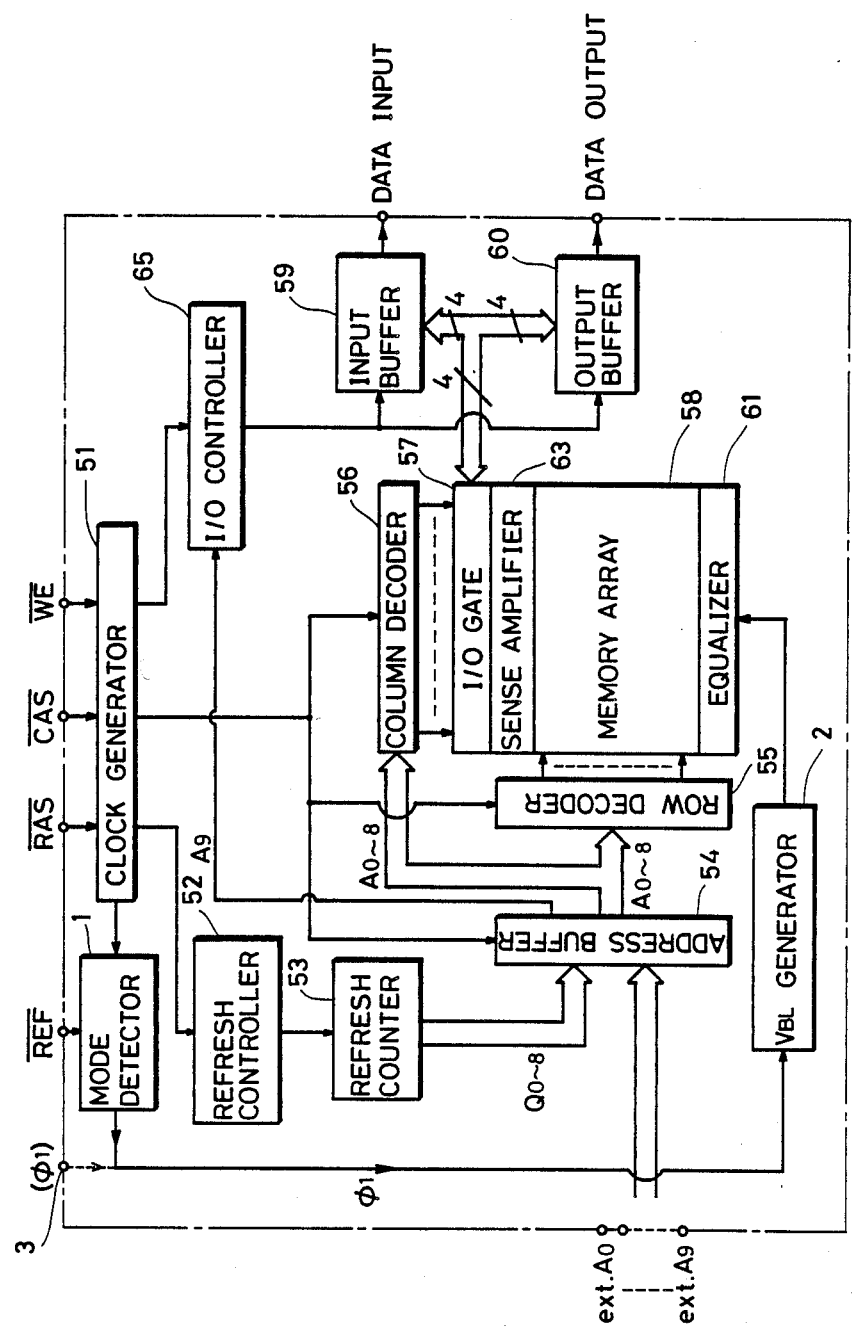
FIG. 1 is a block diagram showing an overall arrangement of a DRAM according to the invention.

Referring to FIG. 1, there is illustrated in block diagram an overall arrangement of a DRAM according to one preferred embodiment of the invention. In contrast to the one shown in FIG. 1, the DRAM of the invention has an additional mode detecting circuit 1 for detecting a command of a self-refresh mode of operation. The mode detecting circuit 1 has its output connected to the voltage generator circuit 2 and is supplied with $\overline{RAS}$ and $\overline{CAS}$ signals by a clock generator 51 or with self-refreshing signal $\overline{REF}$ directly from the outside. In response to the applied signal, the mode detecting circuit 1 provides and supplies a control signal $\phi_1$ to the precharge voltage generating circuit 2, indicating that the self-refresh mode of operation has been selected. The control signal $\phi_1$ may alternatively be supplied to the generator circuit 2 directly from outside via the terminal 3.

Figure 2A:
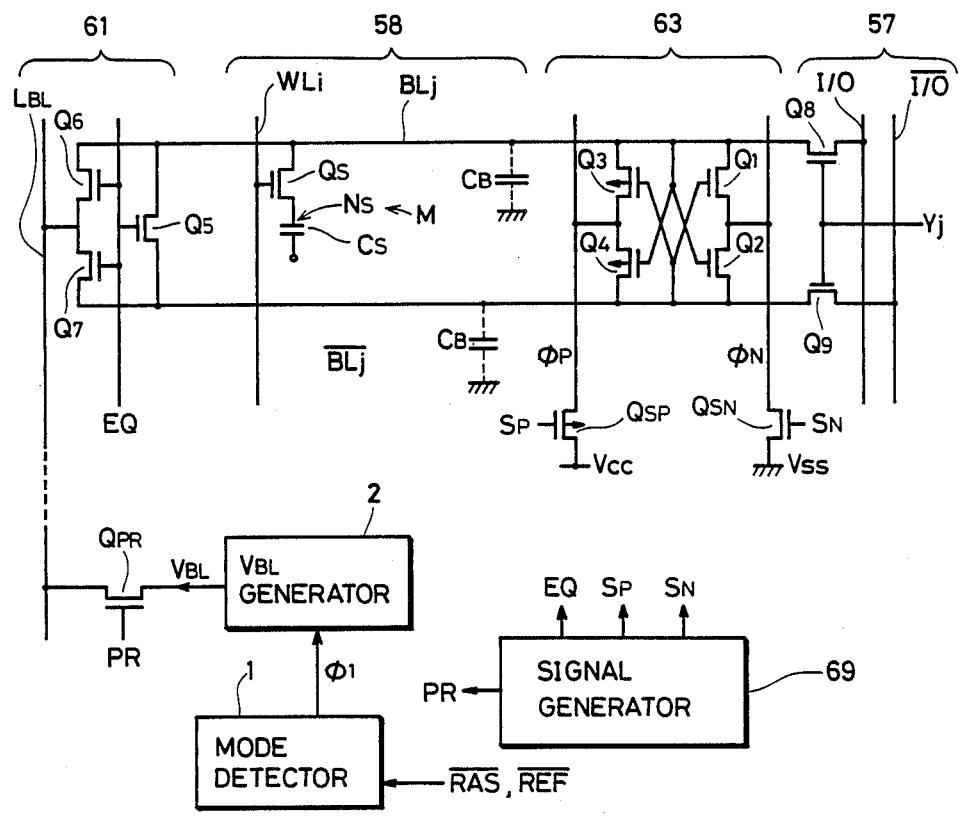
FIG. 2A is a circuit diagram of the DRAM shown in FIG. 1.
Figure 2B:
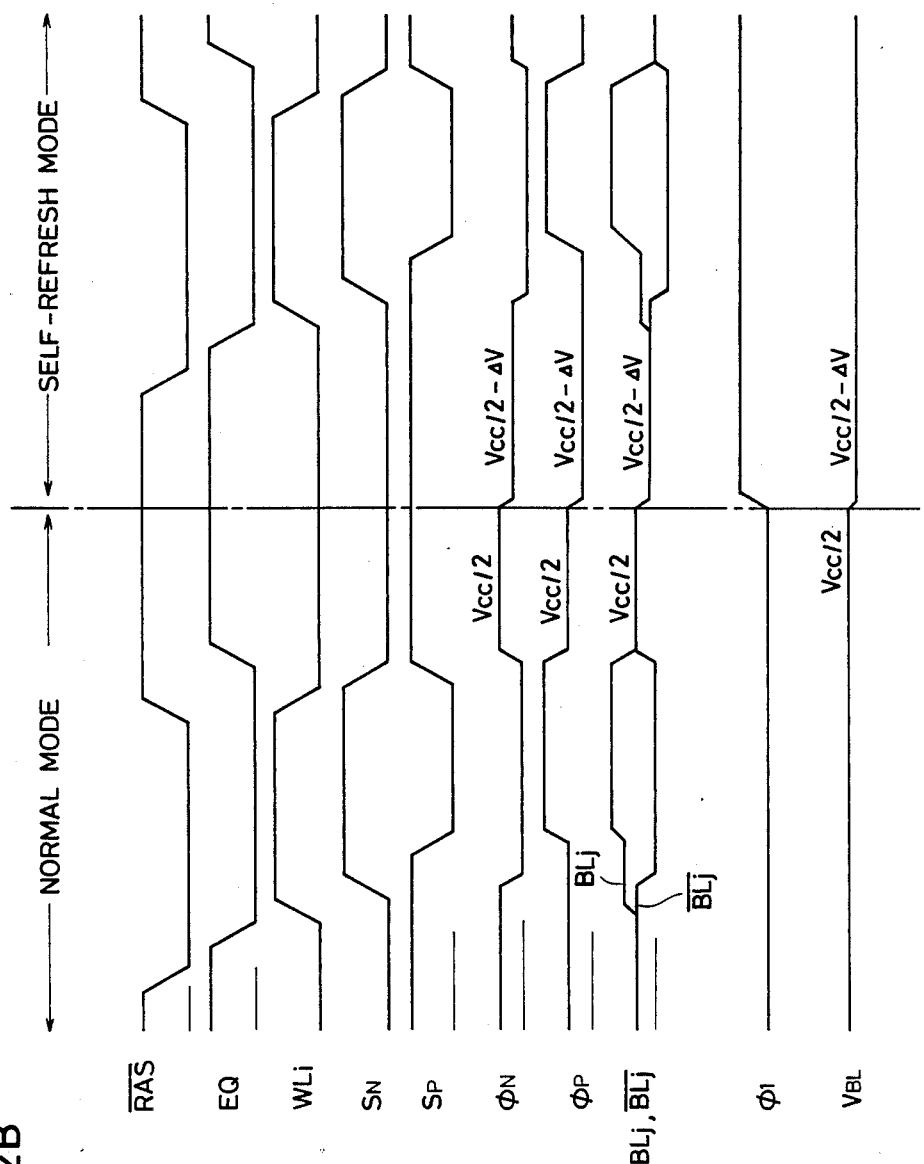
FIG. 2B is a timing diagram for the circuit of FIG. 2A.

Now the operation of the DRAM is described having reference to FIG. 2A which shows some major component parts in the DRAM of FIG. 1 and their circuit connections, and to FIG. 2B which shows a timing diagram for the circuit illustrated in FIG. 2A.

Figure 6A:
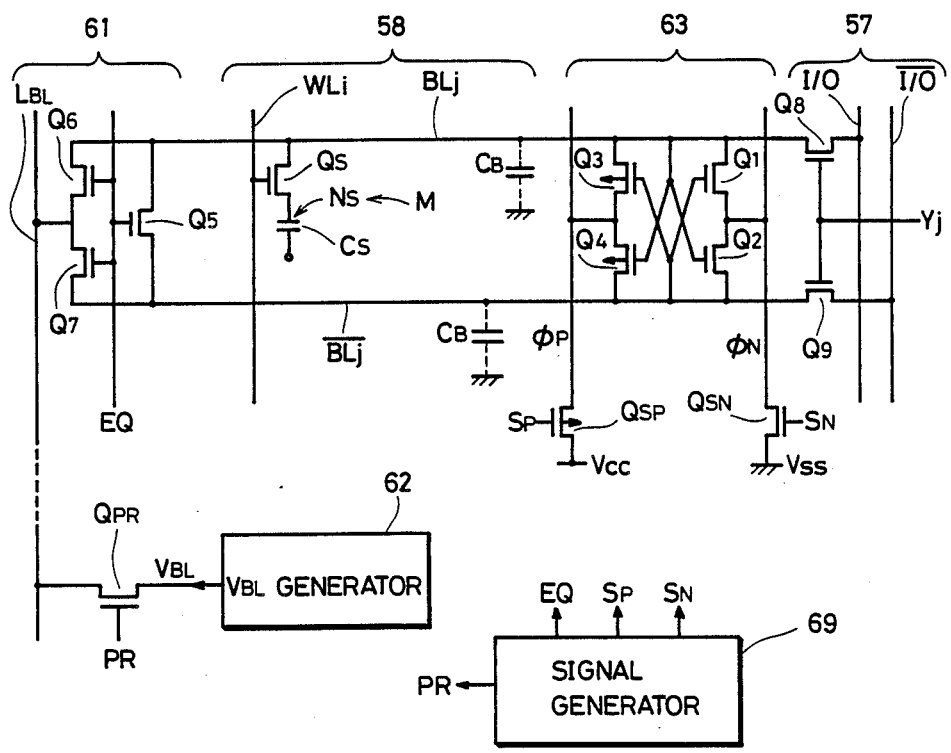
FIG. 6A a circuit diagram for the DRAM of FIG. 6A.
Figure 6B:
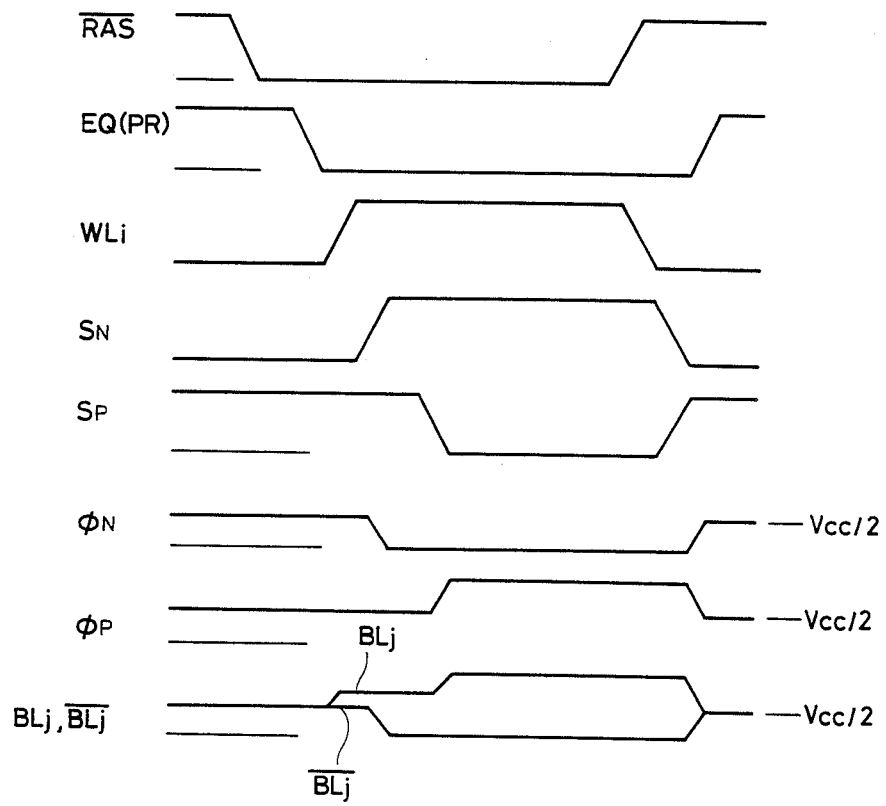
FIG. 6B is a timing diagram for the circuit of FIG. 6A.

In the normal modes of operation such as the read-out and auto-refresh cycles, the DRAM operates in much the same as explained in connection to FIG. 6B. In the normal mode of operation, the mode detect circuit 1 provides a low-level output signal $\phi_1$, in response to which the precharge voltage generator circuit 2 produces an output voltage of Vcc/2.

When the self-refresh mode is selected, the mode detect circuit 1 generates a high level output signal $\phi_1$. Upon the receipt of the high level output signal $\phi_1$, the voltage generator circuit 2 produces an output voltage lower than Vcc/2 by $\Delta V$, thereby improving the sense margin in the self-refresh cycle.

More specifically, assuming that the precharge voltage level is at Vcc/2 $-\Delta V$, then the potential change $V_{SH2}$ on the bit line BLj corresponding to the one expressed by equation (1) is:

$$\Delta V_{SH2} = [Vhd\ H - (VCC-2 = \Delta V/2] = CS/(C_B + C_S)$$

thus, from the equations (1) and (4), $$\Delta V_{SH2} - \Delta V_{SH1} = \Delta V \times C_S/(C_B+C_S) \quad (5)$$

It is apparent that a greater read-out voltage appears on the bit line BLj.

Figure 2C:
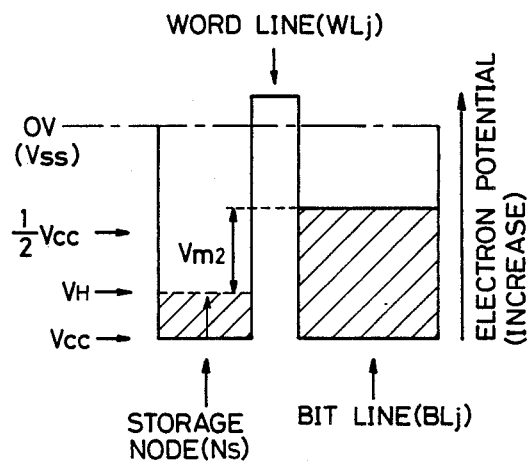
FIG. 2C is a schematic illustration showing the relations between potentials on the memory cell capacitor and bit line.

Improved relations between the potential on the memory cell capacitor and the bit line potential (electron potential) are shown in FIG. 2C. As can be seen, when the level of the precharge voltage on the bit line BLj drops to Vcc/2 $-\Delta V$, the electron potential on the bit line increases, thereby providing a sensing margin Vm2 greater than the sensing margin Vm1 of FIG. 8.

FIGS. 3A to 3E show various circuit configurations the bit line precharge voltage generating circuit 2.

Figure 3A:
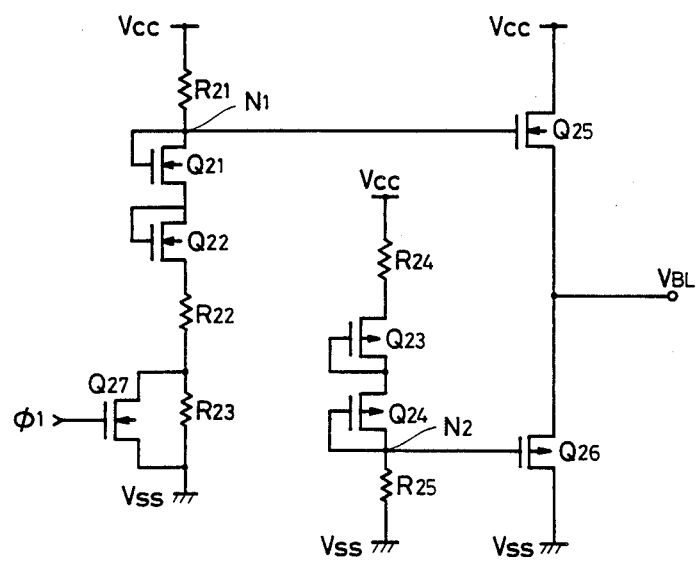
FIG. 3A–3E are circuit diagrams showing various configurations of the voltage generator circuit for generating bit line precharge voltage shown in FIG. 1.
Figure 3B:
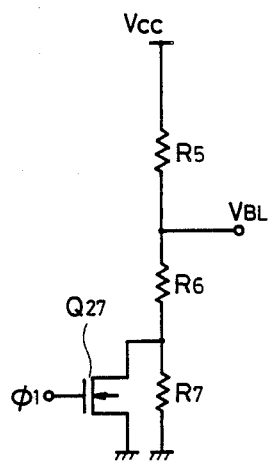

Referring to FIG. 3A, the voltage generator circuit 2 includes a first series connection of resister R21, NMOS transistors Q21 and Q22, and resistors R22 and R23 which are inserted between the supply voltage Vcc and the ground potential Vss; a second series connection of resistor R24, PMOS transistors Q23, Q24 and Q25, all of which are inserted between the supply voltage Vcc and the ground potential Vss; and a third series connection of NMOS transistor Q25 and PMOS transistor Q26 inserted between the supply voltage Vcc and the ground potential Vss. Connected across the resistor R23 is an NMOS transistor Q27. The transistor Q27 has its gate connected to receive the output signal from the mode detector circuit 1, while transistors Q21, Q22, Q23 and Q24 have their gates coupled to their respective drains. In the third series connection, the transistor Q25 has its gate connected to the junction node N1 between the resistors R21 and a transistor Q21, and the other transistor Q26 has its gate coupled to the node N2 between transistor Q24 and resistor R25. The desired bit line precharge voltage $V_{BL}$ is obtained at the junction point between the transistors Q25 and Q26.

In the normal mode of operation, the transistor 27 is turned off in response to the low level output signal $\phi_1$ supplied thereto from the mode detect circuit 1. Then the voltage $V_{N1A}$ at the node N1 is $$V_{N1A} = \quad (6)$$

$$\{Vcc(R22 + R23) + (Vt1 + Vt2)R21\}/(R21 + R22 + R23)$$

and the voltage at the node N2 is given by $$V_{N2} = (Vcc = Vt\ 3 - Vt\ 4)R25/(R24 + R25) \quad (7)$$

where Vt1, Vt 2, Vt 3 and Vt 4 represent, respectively, the threshold voltages of the transistors Q21, Q22, Q23 and Q24. The transistors Q25 and Q26 are turned on by the voltage $V_{N1A}$, $V_{N2}$, respectively, applied to their gates. Upon the conduction of the transistors Q25 and Q26, the bit line precharge voltage $V_{BL}$ of Vcc/2 is provided at their common junction point.

On the other hand, in the self-refresh cycle, the transistor Q27 is turned on by a high level output signal $\phi_1$ supplied from the mode detecting circuit 1. The voltage $V_{N1B}$ on the node N1 is given by $$V_{N1B} = \{VccR2 + (Vt1 + Vt2)R21\}/(R21+R22) \quad (8)$$

The transistor Q25 is moderately turned on by the voltage $V_{N1B}$, which in turn lower the precharge voltage $V_{BL}$ by $\Delta V$ than in the normal mode of operation.

Figure 3C:
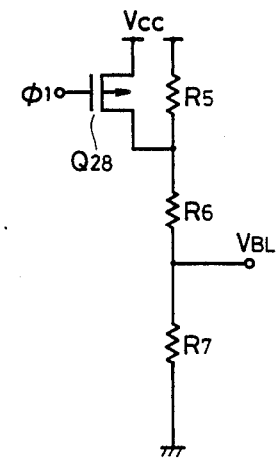

Referring to FIGS. 3B–3E, there are shown other precharge generator circuits according to the invention, and they commonly includes resistors R5, R6 and R7 which are series connected between the supply voltage Vcc and the ground. In the generator circuit of FIG. 3B, an NMOS transistor Q27 is coupled across the resistor R7 and has its gate connected to receive the output signal $\phi_1$. In FIG. 3C, a PMOS transistor Q28 is provided across the resistor R5 and has gate coupled to receive the output signal $\phi_1$.

Figure 3D:
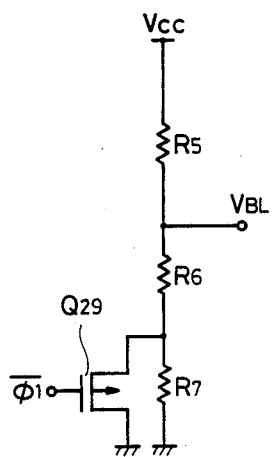
Figure 3E:
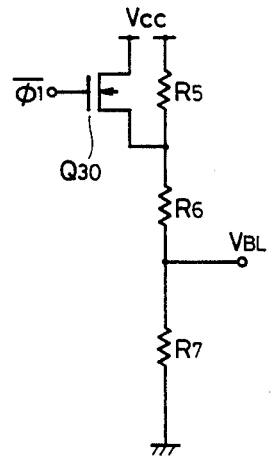

In the circuit of FIG. 3D, a PMOS transistor Q27 is coupled across the resistor R7 and has its gate connected to receive an inverted output signal $\phi_1$. In FIG. 3E, an NMOS transistor Q30 is provided across the resistor R5 and has its gate connected to receive an inverted signal $\phi_1$.

Figure 4A:
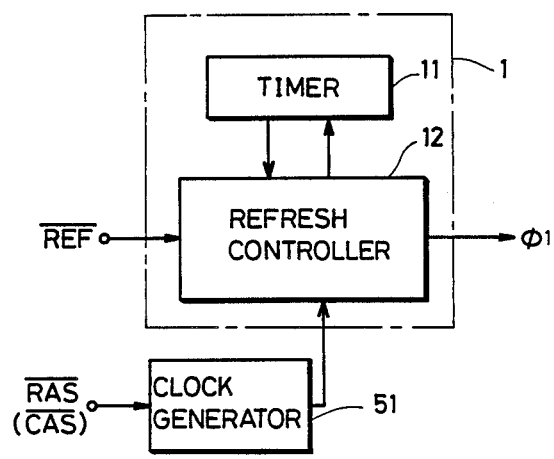
FIG. 4A is a block diagram of a mode detector circuit shown in FIG. 1.
Figure 4B:
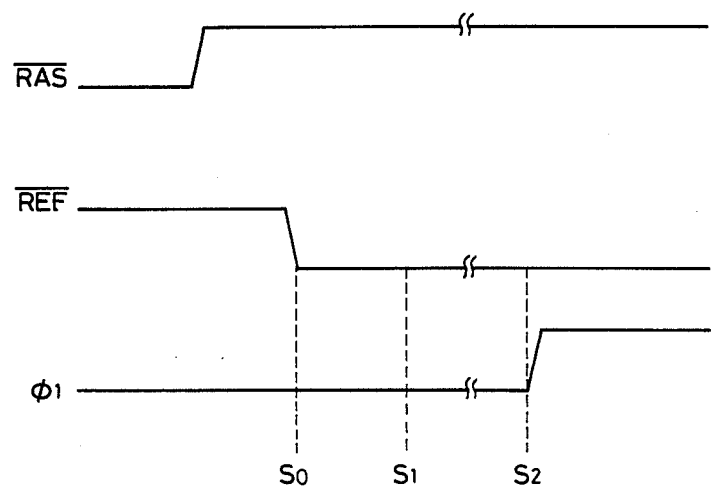
FIG. 4B is a timing diagram for the mode detector circuit of FIG. 4A.
Figure 5:
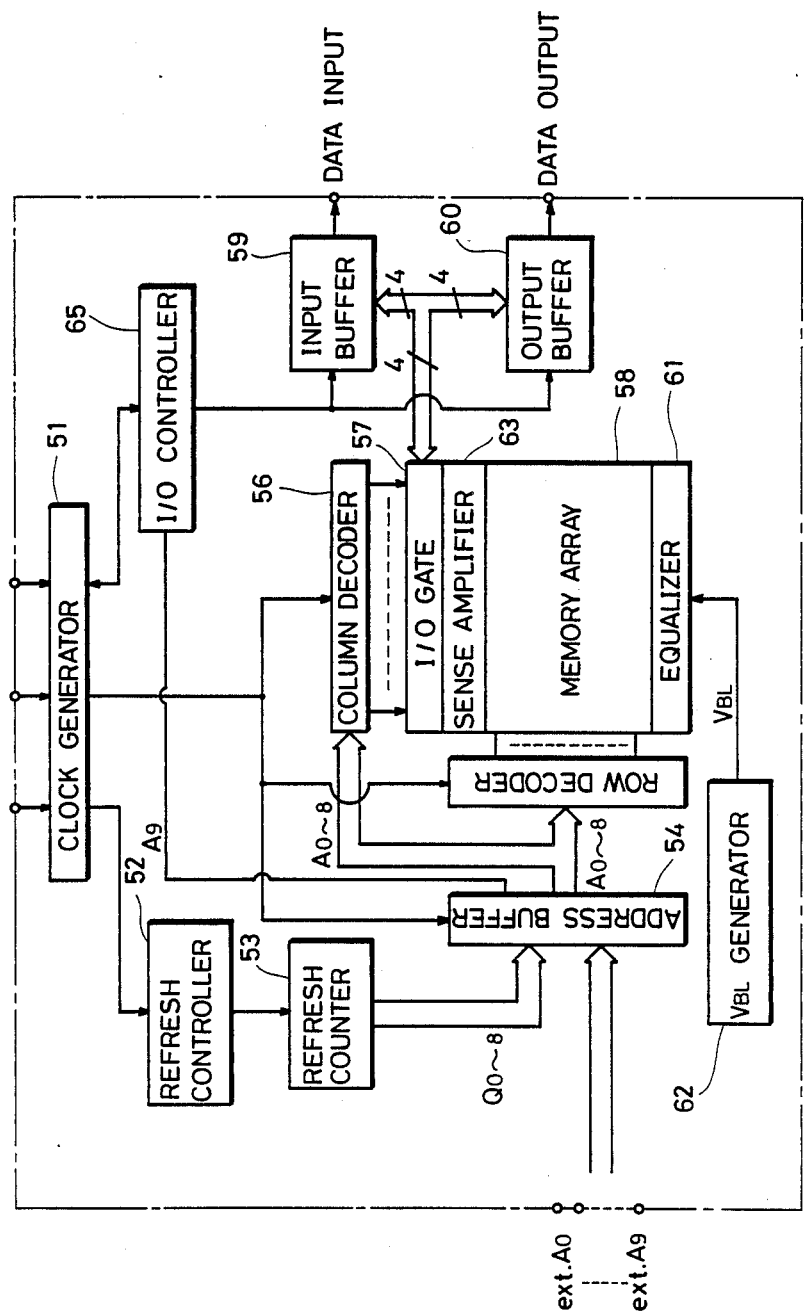
FIG. 5 is a block diagram showing an overall arrangement of a prior-art DRAM.

FIG. 4A illustrate in block diagram an arrangement of the mode detector circuit 1, and FIG. 4B shows a timing diagram for the circuit. The mode detector circuit includes a refresh control circuit 12 connected to receive the externally applied refresh control signals $\overline{REF}$, and a timer 11. The refresh circuit 12 is also supplied with the $\overline{RAS}$ signal by a clock generator 51.

In operation, at time S0 after the $\overline{RAS}$ signal has gone up to the high level, the $\overline{REF}$ signal falls to the low level. It is noted that the timer 11 starts its operation at S1. When the refresh control circuit 12 detects that the low level $\overline{REF}$ signal has been applied beyond the predetermined duration set by the timer, it generates an high level output signal $\phi_1$. It is possible to use the $\overline{CAS}$ signal instead of the $\overline{RAS}$ signal.

While this invention has been described being applied to the DRAM having the self-refresh mode of operation, the present invention is also applicable to any DRAM which is capable of performing an automatic periodic refresh cycles.

In view of the foregoing description of the preferred embodiment of the invention, the sensing margin of the sense amplifier has been greatly improved by keeping the precharge voltage for the bit line pair in the self-refresh cycle at a level lower than in the normal operating cycle. This allows to set the time intervals between the self-refresh cycles much longer with an accompany result of substantially reducing the current consumption during the refresh operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device having normal read, write and refresh modes of operation and an additional self-controlled periodic refresh mode of operation comprising:
    a pair of first and second bit lines;
    at least one memory cell connected to said first bit line, said memory cell having a capacitor element for storing a data signal, the voltage level of said data signal stored in said capacitor element having a tendency to change toward a ground potential;
    input means for receiving externally applied mode select signal for selecting one of said normal operating modes or said additional self-controlled refresh mode;
    precharge voltage generator means for generating a first level voltage between a supply voltage and a ground potential for precharging said bit line pair;
    equalizing means connected to said precharge voltage generating means for equalizing said bit line pair to said first level voltage in response to said mode select signal applied to said input means for selecting one of said normal operating modes;
    said precharge voltage generator means generating a second level voltage between said first level voltage and said ground potential for precharging said bit line pair,
    said equalizing means equalizing said bit line pair to said second level voltage in response to said mode select signal applied to said input means for selecting said additional self-controlled mode of operation,
    means for receiving an address signal for designating said memory cell;
    said memory cell further including means for transferring the data signal stored in said capacitor element in said memory cell to said first bit line in response to the address signal applied to said address signal receiving means; and
    sense amplifier means connected between said first and second bit lines for amplifying a potential difference therebetween.

2. A dynamic random access memory device according to claim 1 wherein said additional self-controlled periodic refresh mode comprises a self-refresh mode.

3. A dynamic random access memory device according to claim 1 further comprising means for internally generating said address signal,
    said means for receiving the address signal being connected to receive externally applied address signal or said internally generated address signal.

4. A dynamic random access memory device according to claim 1 wherein said input means for receiving externally applied mode select signal comprises means for receiving externally applied refresh control signal for controlling said refresh mode of operation.

5. A dynamic random access memory device according to claim 4 wherein said memory device being controlled by a row address strobe $\overline{RAS}$ signal and a column address strobe $\overline{CAS}$ signal, said input means for receiving externally applied mode select signal further comprising
    means for receiving externally applied said $\overline{RAS}$ signal or $\overline{CAS}$ signal, and
    means for detecting the selected mode of operation in response to said $\overline{CAS}$ signal or $\overline{RAS}$ signal.

6. A dynamic random access memory device according to claim 1 wherein said precharge voltage generator means comprising:
    means for generating said first level voltage, and
    means for shifting the output voltage of said means for generating said first level voltage to said second level voltage in response to the mode select signal for selecting said additional refresh mode of operation.

7. A dynamic random access memory device according to claim 6 wherein said precharge voltage generating means comprises:
    a power supply terminal;
    the ground terminal; and
    a plurality of resistor means connected in series between said power supply terminal and said ground terminal,
    said means for shifting said output voltage comprises a first field effect device having a control electrode, connected across one of said plurality of resistor means,
    said first field effect device having the control electrode connected to receive signal from said input means for receiving mode select signal.

8. A dynamic random access memory device operating selectively at a first refresh rate and a second lower refresh rate comprising:
    a pair of first and second bit lines;
    at least one memory cell connected to said first bit line, said memory cell having a capacitor element for storing a data signal, the voltage level of said data signal stored in said capacitor element having a tendency to change toward a ground potential;
    precharge voltage generator means for generating a first voltage level in the first refresh rate and for generating a second voltage level in the second refresh rate;
    equalizing means connected to said precharge voltage generator means for equalizing said bit line pair to the first voltage level in the first refresh rate and to the second voltage level in the second refresh rate;
    means for receiving an address signal for designating said memory cell;
    said memory cell further including means for transferring the data signal stored in said capacitor element in said memory cell to said first bit line in response to the address signal applied to said address signal receiving means; and
    sense amplifier means connected between said first and second bit lines for amplifying a potential difference therebetween.

9. In a dynamic random access memory device operating selectively at a first refresh rate and a second lower refresh rate, comprising:
   a pair of first and second bit lines,
   at least one memory cell connected to said first bit line, said memory cell having a capacitor element for storing a data signal, the voltage level of said data signal stored in said capacitor element having a tendency to change toward a ground potential;
   precharge voltage generator means for generating a precharge voltage for said bit line pair;
   equalizing means connected to said precharge voltage generator means for equalizing said bit line pair to the precharge voltage generated from said precharge voltage generator means;
   means for receiving an address signal for designating said memory cell;
   said memory cell further including means for transferring the data signal stored in said capacitor element in said memory cell to said first bit line in response to the address signal applied to said address signal receiving means; and
   sense amplifier means connected between said first and second bit lines for amplifying a potential difference therebetween;
   an improvement, comprising:
   said precharge voltage generator means generating selectively a first voltage level and a second lower voltage level in response respectively to said first refresh rate and second lower refresh rate.

10. A method of operating a dynamic random access memory device operating selectively at a first refresh rate and a second lower refresh rate, comprising:
   a pair of first and second bit lines,
   at least one memory cell connected to said first bit line, said memory cell having a capacitor element for storing a data signal, the voltage level of said data signal stored in said capacitor element having a tendency to change toward a ground potential;
   precharge voltage generator means for generating a precharge voltage for said bit line pair;
   equalizing means connected to said precharge voltage generating means for equalizing said bit line pair to the precharge voltage generated from said precharge voltage generator means;
   means for receiving an address signal for designating said memory cell;
   said memory cell further including means for transferring the data signal stored in said capacitor element in said memory cell to said first bit line in response to the address signal applied to said address signal receiving means; and
   sense amplifier means connected between said first and second bit lines for amplifying a potential difference therebetween;
   said method comprising the steps of:
   refreshing said memory device at the first refresh rate, while generating the precharge voltage at a first level;
   refreshing said memory device at the second refresh rate, while generating the precharge voltage at a second lower level.

* * * * *